United States Patent
Gotz et al.

(10) Patent No.: US 7,714,669 B2
(45) Date of Patent: May 11, 2010

(54) PHASE ALIGNMENT CIRCUIT FOR A TDC IN A DPLL

(75) Inventors: Edmund Gotz, Dachau (DE); Klaus Peter Meiser, Holzkirchen (DE)

(73) Assignee: Infineon Technologies AG, Neubiberg (DE)

(*) Notice: Subject to any disclaimer, the term of this patent is extended or adjusted under 35 U.S.C. 154(b) by 24 days.

(21) Appl. No.: 12/139,982

(22) Filed: Jun. 16, 2008

(65) Prior Publication Data

US 2009/0309664 A1 Dec. 17, 2009

(51) Int. Cl.
*H03L 7/191* (2006.01)

(52) U.S. Cl. .............................. 331/17; 331/16; 331/25
(58) Field of Classification Search ................... 331/16, 331/17, 25
See application file for complete search history.

(56) References Cited

U.S. PATENT DOCUMENTS 7,486,147 B2 * 2/2009 Khorram ..................... 331/16
7,564,281 B2 * 7/2009 Luo et al. ................... 327/156

* cited by examiner

*Primary Examiner*—Robert Pascal
*Assistant Examiner*—James E Goodley
(74) *Attorney, Agent, or Firm*—Lee & Hayes, PLLC

(57) ABSTRACT

The present disclosure relates to circuits and methods for accelerating a new frequency lock-in process of a digital phase-locked loop.

20 Claims, 8 Drawing Sheets

PHASE ALIGNMENT CIRCUIT FOR A TDC IN A DPLL

BACKGROUND

Numerous types of electronic devices make use of phase-locked loops (PLLs), wherein both analog and digital varieties of PLLs are known. Such devices include, for example, cellular telephones, radio transceivers, process controllers and other instrumentation, and so on. Phase-locked loops are often employed in frequency synthesis. Most advanced frequency synthesizers within RF communication systems have full digital implementations and are referred to as digital PLLs (DPLLs), or all-digital PLLs. The functional circuitries of a DPLL are designed as digital control blocks, wherein all internal signals between the different functional blocks of the PLL are digital in format.

One performance criteria of a DPLL is referred to as the "lock-in criterion" or "settling time", and is defined by the time required for the DPLL to lock onto (i.e., stabilize at) a new operating frequency. Thus, the lock-in criterion refers to a transitory characteristic of the DPLL. Typically, DPLLs have a relatively limited "capture range", or frequency range about the new operating point wherein the DPLL will positively lock (i.e., settle) once the digital controlled oscillator of the DPLL is shifted sufficiently toward the new operating frequency. It is desirable to achieve lock at the new operating frequency as quickly as possible.

FIG. 1 depicts a DPLL 100 in accordance with known techniques. The DPLL 100 includes a time-to-digital converter (TDC) 102, which serves to measure the time delay between the phase of a reference clock input ($F_{ref}$) and the phase of a divided-by-N (wherein N is integer or fractional value) digital controlled oscillator (DCO) signal ($F_v$) 114. One of ordinary skill in the art will appreciate that in modern PLL frequency synthesizers, the integer divider ratio is changed every reference period by a sigma-delta modulator in order to generate a fractional divider ratio on an average. The output from the TDC 102 is a digital word 104 representing the phase- or time-error between the two signals $F_{ref}$ and $F_v$. The digital word 104 from the TDC 102 is filtered and processed by a digital loop filter (DLF) 106. The DLF 106 thus derives a frequency control word (FCW) 108 that is sent to a DCO 110. The FCW 108 represents an error between the instantaneous operating frequency and the newly desired operating frequency of the DCO 110. These operating parameters can be thought of in terms of classic control theory as "process variable" (i.e., present value) and "set point" (i.e., desired value), respectively. In any case, the DCO 110 responds to the FCW 108 and shifts its operating frequency accordingly toward the new operating point. In turn, the output frequency ($F_{dco}$) 116 of the DCO 110 is provided to a counter/divider 112 that divides the $F_{dco}$ signal 116 by an integer or fractional "N" so as to derive the $F_v$ signal 114 in accordance with equation 1 below:

$$F_v = F_{dco}/N \quad \text{(Equation 1)}$$

The lock-in criterion depends on various system and circuit parameters such as, for example, the loop bandwidth of the loop filter, the gain of the DCO (e.g., 110), and the gain of the TDC (e.g., 102) in a purely digital implementation. The capture range of the TDC is also an important parameter regarding lock-in performance of a DPLL (e.g., 100). Typically, the phase detector in an analog PLL (not shown) is implemented as a phase frequency detector that has a phase sensitivity of one period of the reference frequency signal (e.g., $F_{ref}$), and an unambiguous frequency selectivity—that is, the present operating frequency is either too high or too low. Such analog PLL's often operate in accordance with "Up" and "Down" signals in regard to shifting their operating frequency.

In contrast, presently used DPLLs include TDCs (e.g., 102) having limited measurement ranges for the time interval between the phases of the two input frequencies (e.g., $F_{ref}$ and $F_v$). Additionally, the TDC often has no frequency selectivity—that is, it cannot distinguish between "too high" and "too low" with respect to operating frequency error. The limited range is inherent in the design of a TDC because a large capture range can generally be reached only with a low time resolution. Conversely, a satisfactory time resolution is only feasible with a small capture range. Thus, a balancing of opposed TDC performance characteristics has been generally necessary. This capture range vs. time resolution relationship is expressed equation 2 below:

$$\phi_{capt} \cdot (T_{ref}/2\pi) = t_{capt} << T_{ref} = 1/F_{ref} \quad \text{(Equation 2)}$$

Wherein:

$\phi_{capt}$ is the span of the capture range in radians;
$T_{ref}$ is the period of the reference frequency in seconds;
$t_{capt}$ is the span of the capture range in seconds; and
$F_{ref}$ is the reference frequency in cycles per second FIG. 2 is a time-to-digital converter (TDC) 200 in accordance with one known approach for dealing with the limited capture range characteristics of typical DPLLs. The TDC 200 receives a reference frequency signal $F_{ref}$ and divided-by-N oscillator signal $F_v$ as respectively introduced above. The TDC 200 then derives a time difference (or error) output signal 202 analogous to signal 104 above. The TDC 200 further provides an out-of-measurement-range output signal 204 that, depending on value, indicates an in- or out-of-capture-range state for the TDC 200. This signal 204 is then used to trigger and/or control additional lock-in measures that are used within the corresponding DPLL (not shown).

FIG. 3 is a signal diagram 300 depicting input vs. output signal performance of a TDC (e.g., 200) having a restricted operating or capture range. As shown, there is a substantially linear relationship between the measured time difference between the $F_{ref}$ and $F_v$ input signals, and the time difference output signal provided by the TDC. Furthermore, the time difference output signal varies, or "swings", over a limited predetermined range wherein a constant-level output signal is provided once the time error between the two input signals $F_{ref}$ and $F_v$ exceeds some $t_{max}$ threshold.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Figure 1:
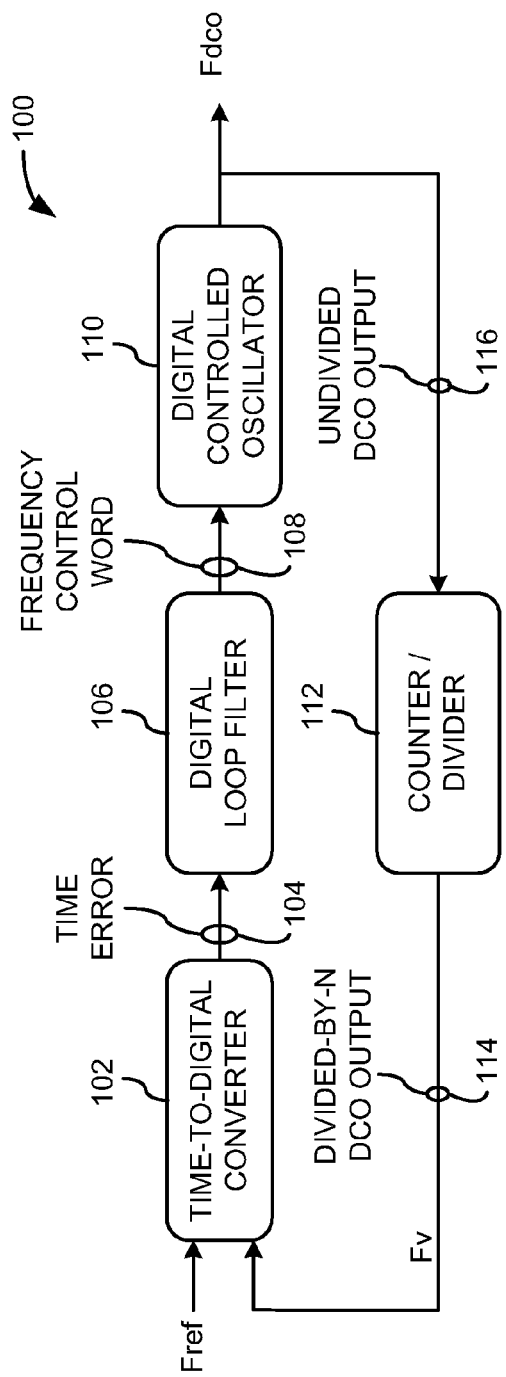
FIG. 1 is a block diagram depicting functional aspects of a digital phase-locked loop in accordance known techniques.
Figure 2:
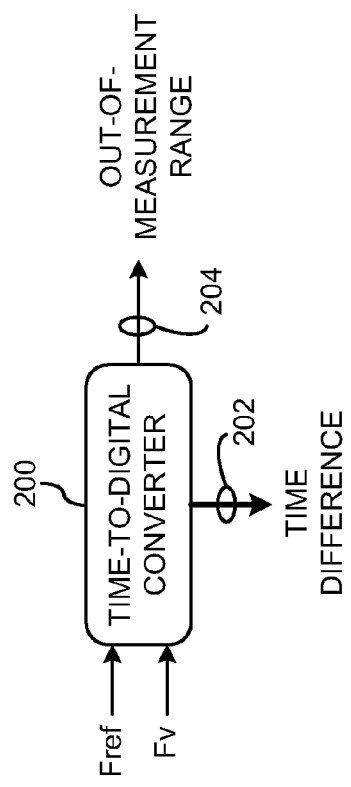
FIG. 2 is a block symbol depicting a time-to-digital converter according to known techniques.
Figure 3:
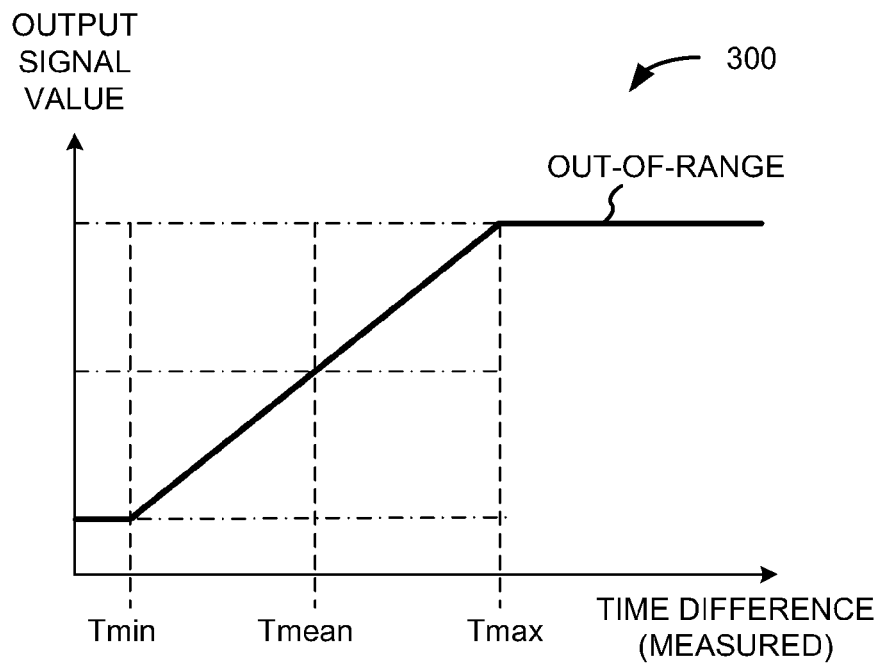
FIG. 3 is a signal diagram according to known techniques.

Disclosed herein are improved techniques for accelerating the new frequency lock-in process of a digital phase-locked loop. Techniques in accordance with the present disclosure may advantageously improve performance and reliability by substantially reducing the time required to establish equilibrium at a new operating frequency. In general, such techniques are useful in a wide range of applications, including frequency synthesis, wireless communications, instrumentation and process control, and so on.

According to one implementation, an electronic circuit is configured to determine a phase relationship between a first signal and a second signal, wherein the second signal is derived by dividing a digital controlled oscillator (DCO) output signal. The electronic circuit is also configured to disable operation of a frequency divider in accordance with the determination, wherein the state of the frequency divider is preserved during the disabling. The electronic circuit is further configured to enable operation of the frequency divider in response to a next rising edge of the first signal. The frequency divider counts toward a predetermined state. The electronic circuit is also configured to provide an output pulse whenever the frequency divider reaches the predetermined state.

According to another implementation, a phase alignment circuit is configured to receive a first signal that corresponds to a phase relationship between a reference frequency signal and a divided-by-N digital controlled oscillator output signal. The phase alignment circuit is also configured to provide a first level output signal responsive to a predetermined state of the first signal. The first level output signal is configured to disable operation of a frequency divider. The phase alignment circuit is also configured to provide a second level output signal responsive to a next rising edge of the reference frequency signal, wherein the second level output signal is configured to enable operation of the frequency divider.

According to still another implementation, a method is performed at least in part by an electronic circuit. The method includes measuring a phase relationship between a reference frequency signal and a divided-by-N digital controlled oscillator output signal. The method also includes disabling the operation of a frequency divider in accordance with the determination. The present state of the frequency divider is preserved during the disabling. The method further includes enabling operation of the frequency divider in response to a next rising edge of the reference frequency signal. The frequency divider counts toward a predetermined state. The method also includes providing an output pulse once the frequency divider reaches the predetermined state.

In yet another implementation, an electronic circuit includes a first circuit portion including at least one flip-flip. The first circuit portion is configured to provide an internal enable/disable signal responsive to a first enable signal and a second enable signal and a first clock signal. The first clock signal corresponds to a divided-by-N digital controlled oscillator output signal. The electronic circuit also includes a second circuit portion including a selector. The second circuit portion is configured to provide a second clock signal in response to a reference clock input signal and an inverted reference input signal. The electronic circuit further includes a third circuit portion including at least two other flip-flops. The third circuit portion is configured to provide a frequency divider enable/disable signal responsive to the internal enable/disable signal and the second clock signal and a third clock signal. The third clock signal corresponds to a phase relationship between a reference frequency signal and the divided-by-N digital controlled oscillator output signal.

In still another implementation, an apparatus includes a source of electrical energy, and a circuit coupled to the source of electrical energy. The circuit includes a digital phase-locked loop and a phase alignment circuit. The phase alignment circuit is configured to controllably enable and disable a frequency divider of the digital phase-locked loop during a frequency lock-in procedure.

Circuits and functional aspects provided herein can be fabricated, at least in part, on a common substrate such that one or more respective integrated circuit devices are defined. In one or more implementations, at least a portion of the functional subject matter presented herein can be fabricated within a 130, 90, 65, 45, or 32 nanometer (or smaller) environment.

The techniques described herein may be implemented in a number of ways. Illustrative context is provided below with reference to the included figures and ongoing discussion.

Illustrative Operating Fundamentals

As to operational context, the following relationships are fundamental to the subject matter of this disclosure.

Phase and frequency are related to one another according to:

$$d\phi/dt = 2\pi \cdot F \qquad \text{(Equation 3)}$$

or $$\phi = 2\pi \cdot \int F \, dt + c \qquad \text{(Equation 4)}$$

Wherein:

$\phi$ is the phase angle in radians;

$d\phi/dt$ is the time derivative of phase in radians per second;

F is the frequency of the signal in cycles per second.

The phase of a signal at a given frequency changes over time according to equation 4 above. An advance or retard of the phase relative to the phase of the reference clock (i.e., $F_{ref}$) can be realized by an increase or a decrease in the frequency of the signal in question. Such a change-in-phase relationship is expressed by:

$$\Delta\phi = 2\pi \cdot \int \Delta F \, dt \qquad \text{(Equation 5)}$$

The relationship between time and phase difference is expressed by:

$$\Delta t = (\Delta\phi / 2\pi) \cdot T_{ref} \qquad \text{(Equation 6)}$$

Wherein:

$\Delta t$ is the time differential in seconds;

$\Delta\phi$ is the phase differential in radians;

$\Delta F$ is the frequency differential in cycles per second; and $T_{ref}$ is the period of the reference frequency in seconds.

Therefore, the time difference is also expressed by:

$$\Delta t = T_{ref} \int \Delta F \, dt \qquad \text{(Equation 7)}$$

Hereinafter, the equivalent time difference notation is used exclusively in the interest of consistency, with respect to the time difference (error) measurements made by a time-to-digital converter (TDC). The relationship of Equation 7 above can be used to bring the time difference or error between the reference frequency and the modulo-divided DCO frequency into the limited capture range of the TDC faster than is typically done. Thus, the lock-in procedure can be significantly accelerated in accordance with the present teachings.

As discussed above, the capture range of a particular TDC (e.g., 102) is defined by the range of time offsets wherein the TDC is sensitive and the time difference between input signals can be determined. Any particular TDC measures this time difference, or error, in accordance with a defined time resolution. When the time difference is in the capture range of the TDC, the phase-locked loop overall is within the operational range wherein frequency lock occurs. When the time difference is not within the capture range, the TDC is essentially in a "dead-lock" condition—that is, no proper time information is available—and the typical lock-in time of the DPLL is not very well controlled and takes longer than desirable.

Figure 4:
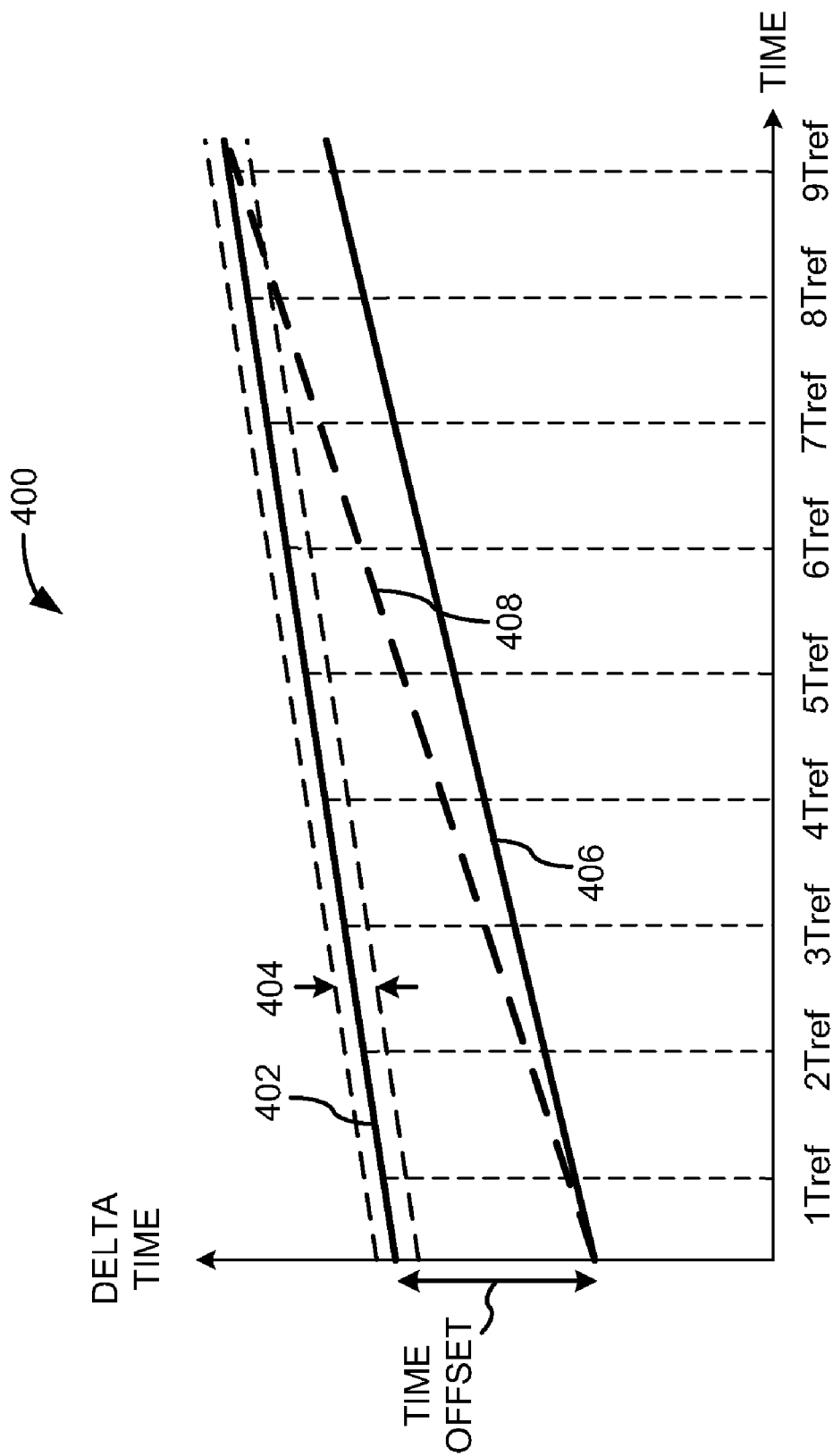
FIG. 4 is a signal timing diagram according to known techniques.

FIG. 4 is a signal timing diagram 400 depicting an illustrative and non-limiting DPLL lock-in procedure with respect to time. For purposes of non-limiting example, it is assumed that the divided DCO (e.g., 110) signal ($F_v$) is greater than the reference frequency signal ($F_{ref}$). In other words, assume an example wherein: $F_v > F_{ref}$. The phase of the constant reference frequency signal 402 advances with time within the indicate capture range 404 of the TDC (e.g., 102). The phase of the divided DCO signal 406 at an un-locked frequency $F_v > F_{ref}$ advances faster and reaches the capture range of the TDC after several reference frequency clock periods. The greater the frequency offset (i.e., signal 408), the earlier the lock-in condition is reached. Thus, the lock-in procedure is a function of the time offset at the beginning of the new lock-in procedure, as well as the divided DCO output frequency $F_v$, which is not fixed. The typical lock-in time is not very well controlled and takes longer than desirable.

Figure 5:
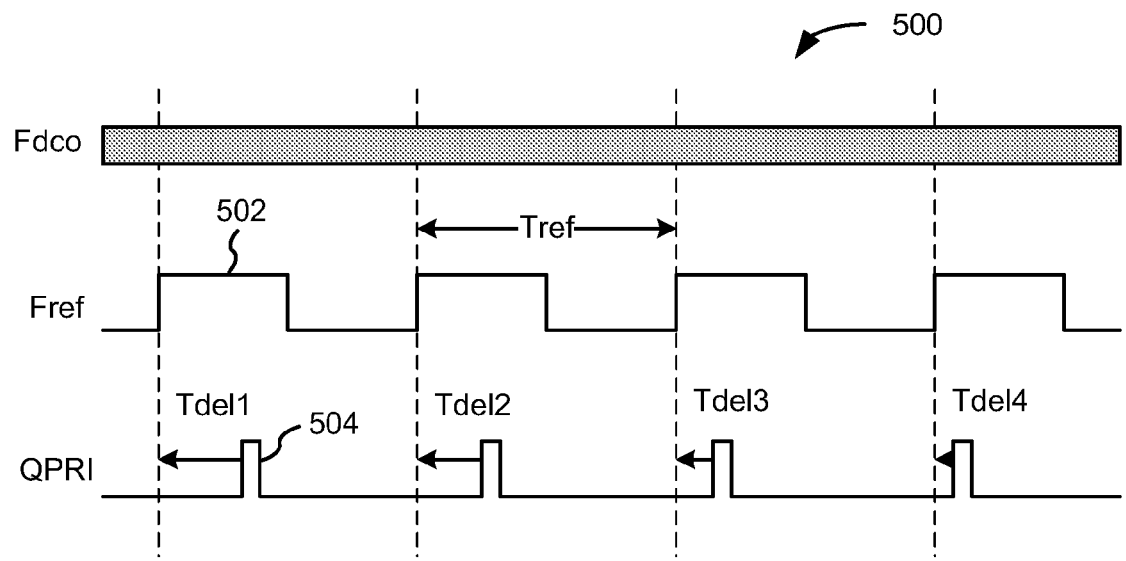
FIG. 5 is another signal timing diagram according to known techniques.

FIG. 5 is a signal timing diagram 500 depicting illustrative and non-limiting signal phase relationships during a typical lock-in procedure in accordance with the known art. A reference frequency signal 502 is defined by a period $T_{ref}$. Additionally, divided DCO signal pulses (QPRI) 504 are provided (i.e., generated) by a counter/divider (i.e., frequency divider) of a DPLL circuit. The time difference between the rising edge of each successive reference frequency signal $F_{ref}$ 502 and the corresponding QPRI pulse 504 is depicted by a time period $T_{del}$. As shown, the time differences $T_{del}$ are decreasing with each successive period of the reference signal 502. Thus, $T_{del1} > T_{del2} > T_{del3} > T_{del4}$. In this way, the divided DCO output signal pulses 504 are becoming progressively synchronized, or aligned, with the reference frequency signal 502. It is noted that, as depicted, several reference frequency periods $T_{ref}$ transpire during this illustrative lock-in procedure.

The time required for a time shift of one whole period $T_{ref}$ is given by:

$$T_{ps} = F_{dco}/(\Delta F_{dco} \cdot F_{ref}) \quad \text{(Equation 8)}$$

Wherein:

$T_{ps}$ is the time in seconds required to perform a time shift of one period $T_{ref}$;

$F_{dco}$ is the frequency of the DCO in cycles per second;

$\Delta F_{dco}$ is the frequency offset=$F_{dco}-N \cdot F_{ref}$; and $F_{ref}$ is the reference frequency in cycles per second.

As shown by Equation 8, the time required to complete one whole-period phase shift is a function of the ratio of $F_{dco}$ to $F_{ref}$, and the frequency offset $\Delta F_{dco}=F_{dco}-N \cdot F_{ref}$. Thus, an increased frequency offset results in a decreased time to complete the phase shift. On the other hand, the greater the initial time difference (measured error) seen by the TDC, the slower the lock-in procedure is completed. When the TDC is in the unlocked state, the offset frequency $\Delta F_{dco}$ can be increased by switching the DCO to a higher frequency offset. This can be controlled with the out-of-measurement range signal (e.g., 204).

First Illustrative Implementation

Another approach to aligning the phases of the reference frequency signal and the divided DCO signal is the subject matter of the teachings herein. Inspection of Equation 4 above reveals that, when the frequency divider for the DCO frequency is stopped (i.e., disabled) for a particular time, the output signal of the frequency divider (e.g., $F_v$) becomes zero and the phase advance of that signal $F_v$ is stopped. Conversely, the time difference (or error) between the two compared signals is changing as the phase of the reference frequency signal (e.g., $F_{ref}$) continues to advance.

In accordance with the present teachings, phase alignment is performed by stopping the frequency divider in such a way that the resulting time difference is near (or within) the capture range of the TDC. Correspondingly, the phase locking procedure is completed faster than by known techniques, where the respective phase difference is changed only by a frequency offset at the DCO. One advantage of the present teachings is that the time required for the phase alignment process is always constant and is independent of the undefined phase offset at the beginning. Under known techniques, the lock-in time can be only reduced by switching the DCO frequency. However, the lock-in time is then a function of the time offset at the beginning and is therefore not well controlled.

Figure 6:
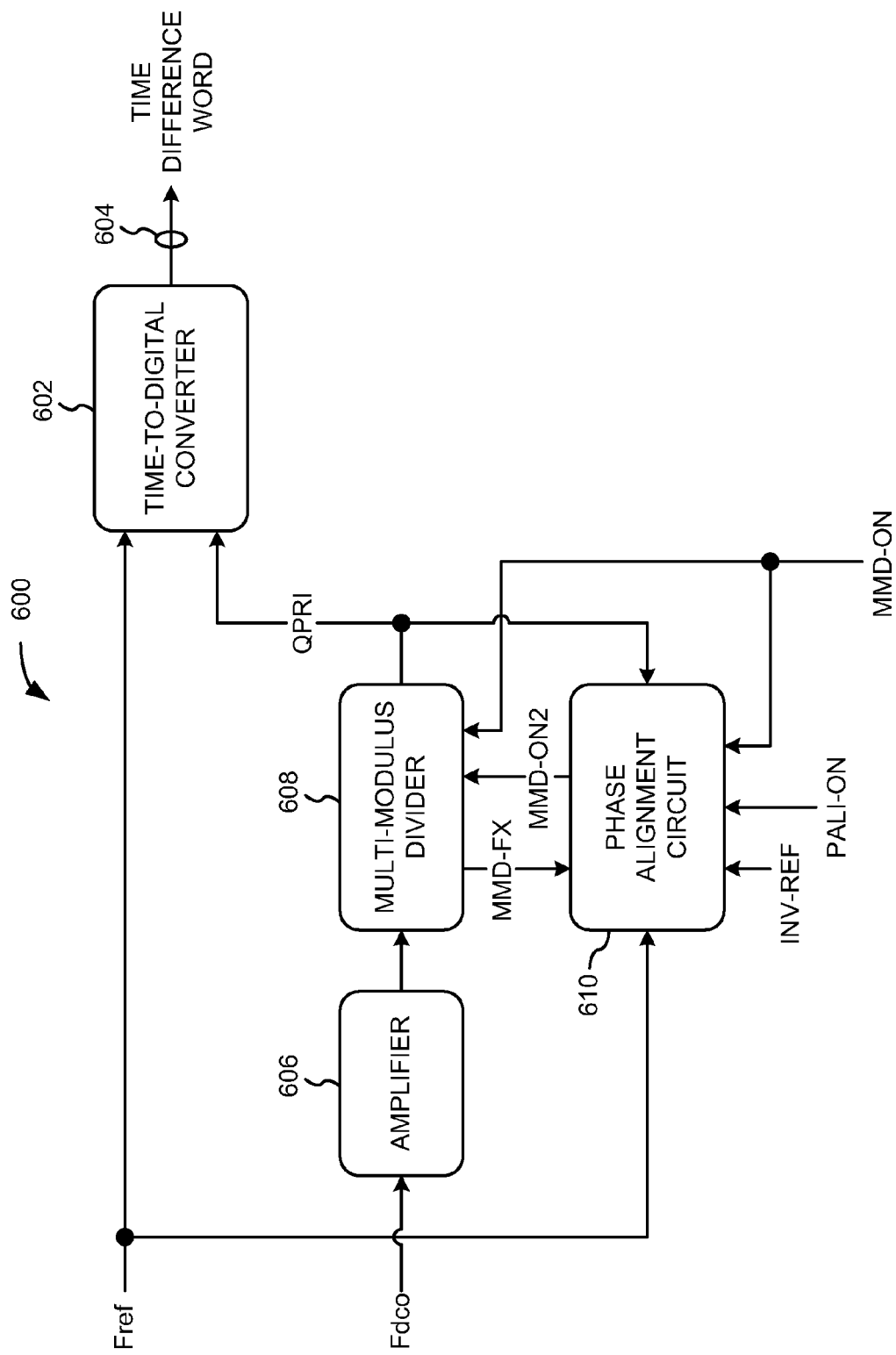
FIG. 6 is a block diagram depicting functional aspects of a digital phase-locked loop in accordance with the present teachings.

FIG. 6 is a block diagram of a portion of a DPLL circuit (hereinafter, circuit) 600 according to the present teachings. The circuit 600 includes a time-to-digital converter (TDC) 602 that is configured to receive a reference frequency signal $F_{ref}$ and a divided oscillator output signal (or pulses) QPRI. The TDC 602 is further configured to provide a digital time difference, or error, word 604. The error (i.e., difference) word 604 is formatted—or is further processed—to control a digital controlled oscillator (DCO, not shown) for purposes of adjusting the DCO output signal.

The circuit 600 also includes an amplifier 606 that is configured to receive a DCO output signal $F_{dco}$ and to provide an amplified and/or buffered version thereof as an output to a multi-modulus divider (MMD) 608. The MMD 608 is configured to divide the input DCO signal by a programmable time-variant integer divider ratio, so that in the time average a fractional divider ratio is realized. The MMD operates in accordance with a selectively adjustable (i.e., programmable) factor (N), and in response to respective control signals that are described in further detail hereinafter. The MMD 608 as described herein is just one of any number of counters and/or frequency dividers that can be used in accordance with the present teachings. The MMD 608 is further configured to provide output signal pulses "QPRI" that directly correspond to the divided DCO signal. The MMD 608 is configured to operate in a cyclic, repetitive manner such that an ongoing sequence of QPRI pulses are generated during normal (i.e., active, or non-halted) operation.

The circuit 600 also includes a phase alignment circuit (PALI) 610. The PALI 610 is configured to receive a signal MMD-FX from the MMD. In typical operation, the MMD-FX signal precedes the QPRI pulse provided by the MMD by only a few cycles of the undivided DCO clock signal. The MMD-FX signal provides information regarding the phase relationship between the divided $F_{dco}$ (i.e., $F_v$) and $F_{ref}$ signals and is used during phase alignment of each new frequency lock-in procedure. The PALI 610 further receives signals $F_{ref}$ and other control signals which are respectively described in further detail hereinafter. In turn, the PALI 610 provides an output signal MMD-ON2 to that is coupled to the MMD 608.

Figure 7:
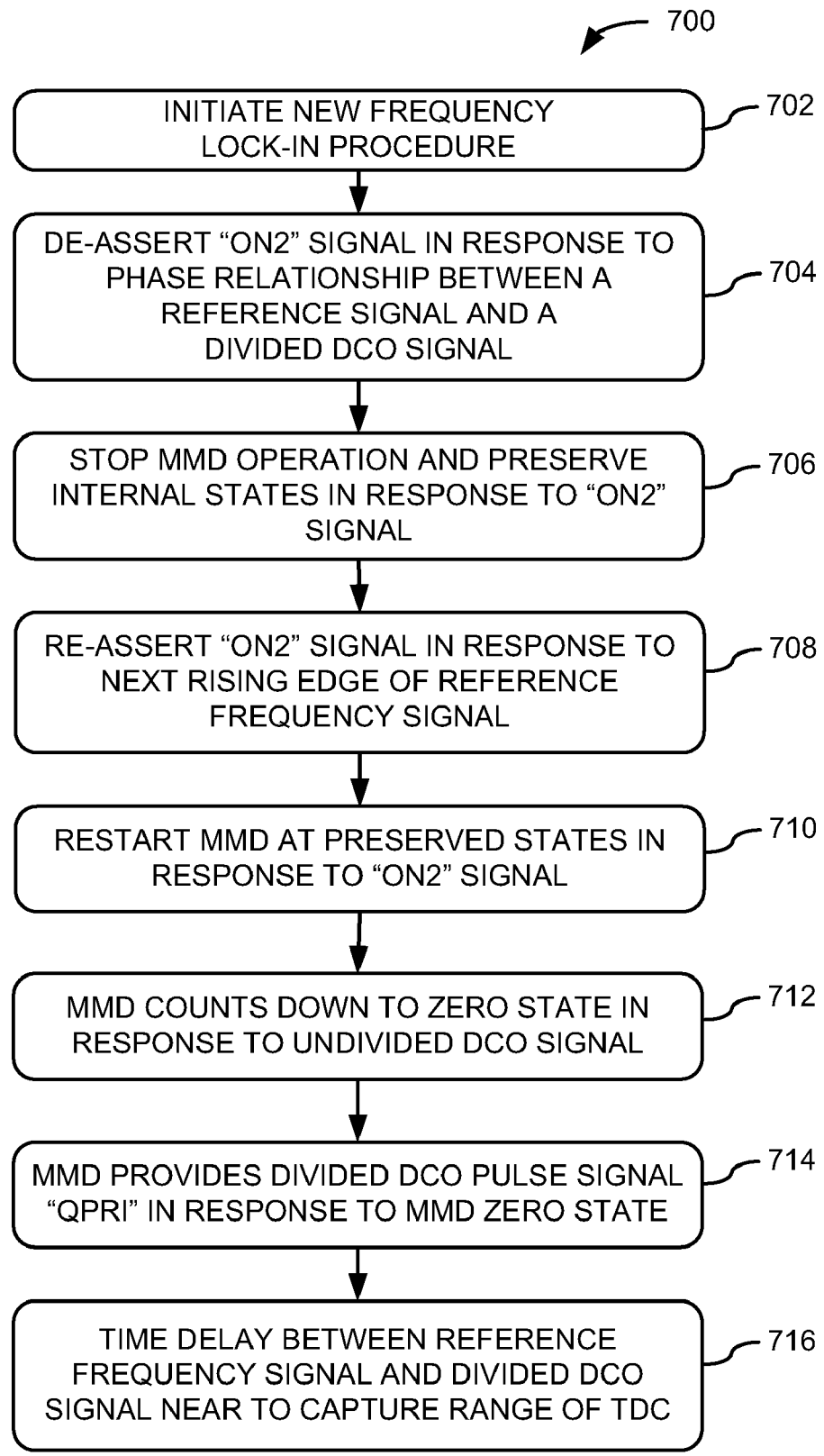
FIG. 7 is flow diagram depicting operational steps in accordance with the present teachings.
Figure 8:
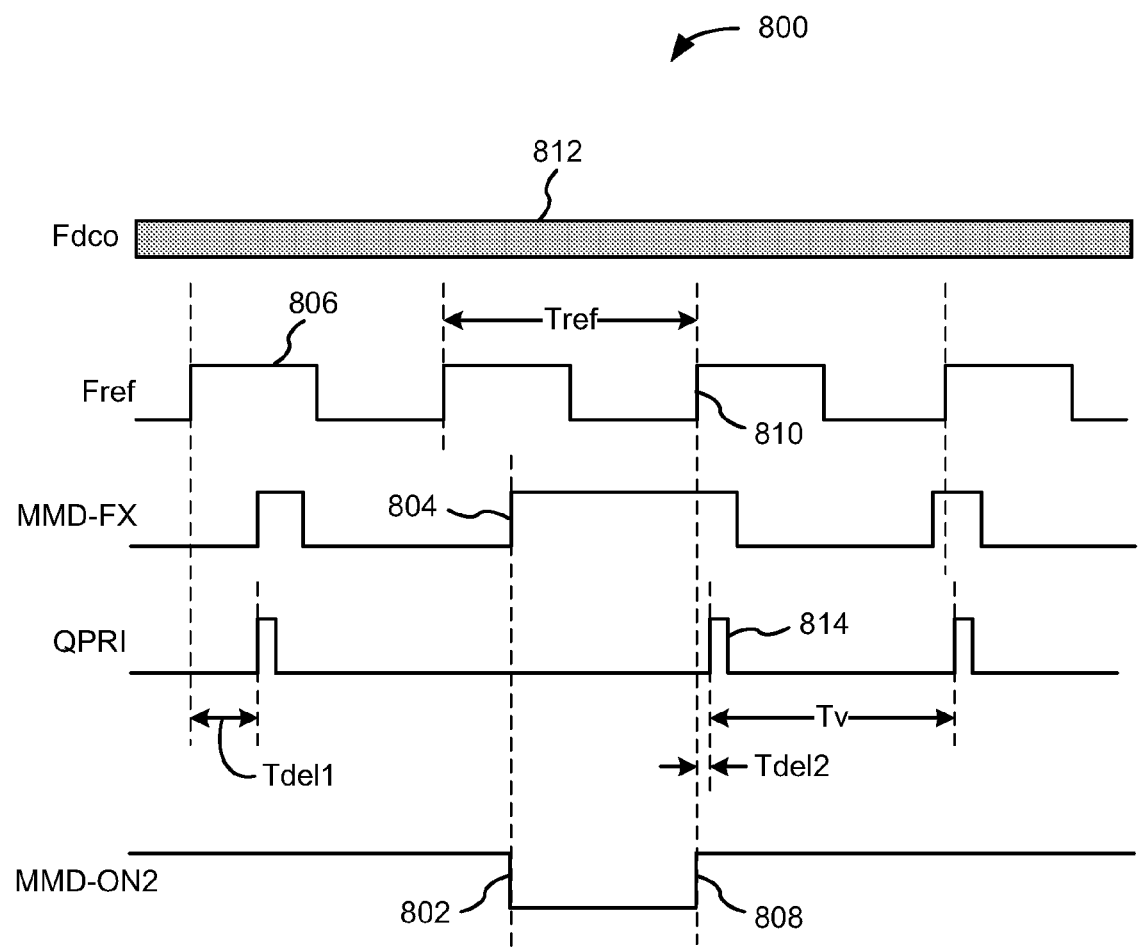
FIG. 8 a signal timing diagram according to the present teachings.

FIG. 7 shows an illustrative operation of the circuit 600 by way of a non-limiting flow diagram 700, while further reference is made to FIG. 8, which is a non-limiting signal timing diagram 800.

At 702, a new lock-in procedure is initiated in response to a required change in operating frequency for a DPLL.

At 704, it is assumed that both the MMD-ON and the PALI-ON signals are respectively asserted. The PALI 610 is now activated (or triggered) in response to the asserted MMD-ON and PALI-ON signals. After the second (or thereafter) QPRI pulse of the MMD and the subsequent rising edge of MMD-FX (at 804), the PALI 610 de-asserts (i.e., turns off) the MMD-ON2 signal (at 802). Thus, the state of the MMD-ON2 signal is directly related to the phase relationship between the $F_{ref}$ 806 and the divided-by-N $F_{dco}$ (i.e., $F_v$) signals, when the PALI 610 is in an active condition.

At 706, the operation of the MMD 608 is stopped, or halted, in response to the de-assertion of the MMD-ON2 signal. The internal state of the MMD 608 is preserved such that any registers, flip-flops, etc. (not shown) of the MMD 608 hold their respective present conditions. The present operation is in sharp contrast to causing a set or reset condition in the MMD 608. QPRI pulses are not generated during the halted state of the MMD 608.

At 708, the PALI 610 re-asserts the MMD-ON2 signal (at 808) in response to the next rising edge of the reference frequency signal ($F_{ref}$) (at 810).

At 710, operation of the MMD 608 is restarted (or resumed) at the states preserved at 706 above in response to re-assertion of the MMD-ON2 signal.

At 712, the MMD 608 counts down to a zero state in response to the DCO output signal $F_{dco}$. Thus, the (undivided) $F_{dco}$ signal 812 serves as a clock signal for the MMD 608.

At 714, the MMD 608 provides an output QPRI pulse signal (at 814) in response to the zero state count of 712 above. The rising edge of the QPRI pulse corresponds to the beginning of the next MMD 608 operational period (i.e., frequency division cycle).

At 716, the phase of the divided DCO signal ($F_v$) and the reference frequency signal ($F_{ref}$) are now delayed or offset by some predefined number of undivided DCO ($F_{dco}$) periods with respect to the reference frequency signal. This newly established time delay (or offset) $T_{del2}$ is near or within the capture range of the TDC 602. At this point, the phase alignment process is completed and the PALI 610 assumes an inactive, standby condition until the next lock-in procedure is initiated.

As described above, the alignment procedure is started at the beginning of each new lock-in process—that is, when a new operating frequency for the corresponding DPLL is required. The PALI 610 is otherwise inactive during normal operation of the DPLL until a new operating frequency is programmed (required) and the next lock-in process is triggered. The duration of the overall phase alignment process depends only on the phase offset between the two signals to be compared ($F_{ref}$ and $F_v$), and the DCO frequency that serves to clock at least the MMD 608. The intrinsic alignment process is finished within one reference period ($T_{ref}$) and is therefore performed faster, on average, than known alternative procedures.

Illustrative Implementation

Figure 9:
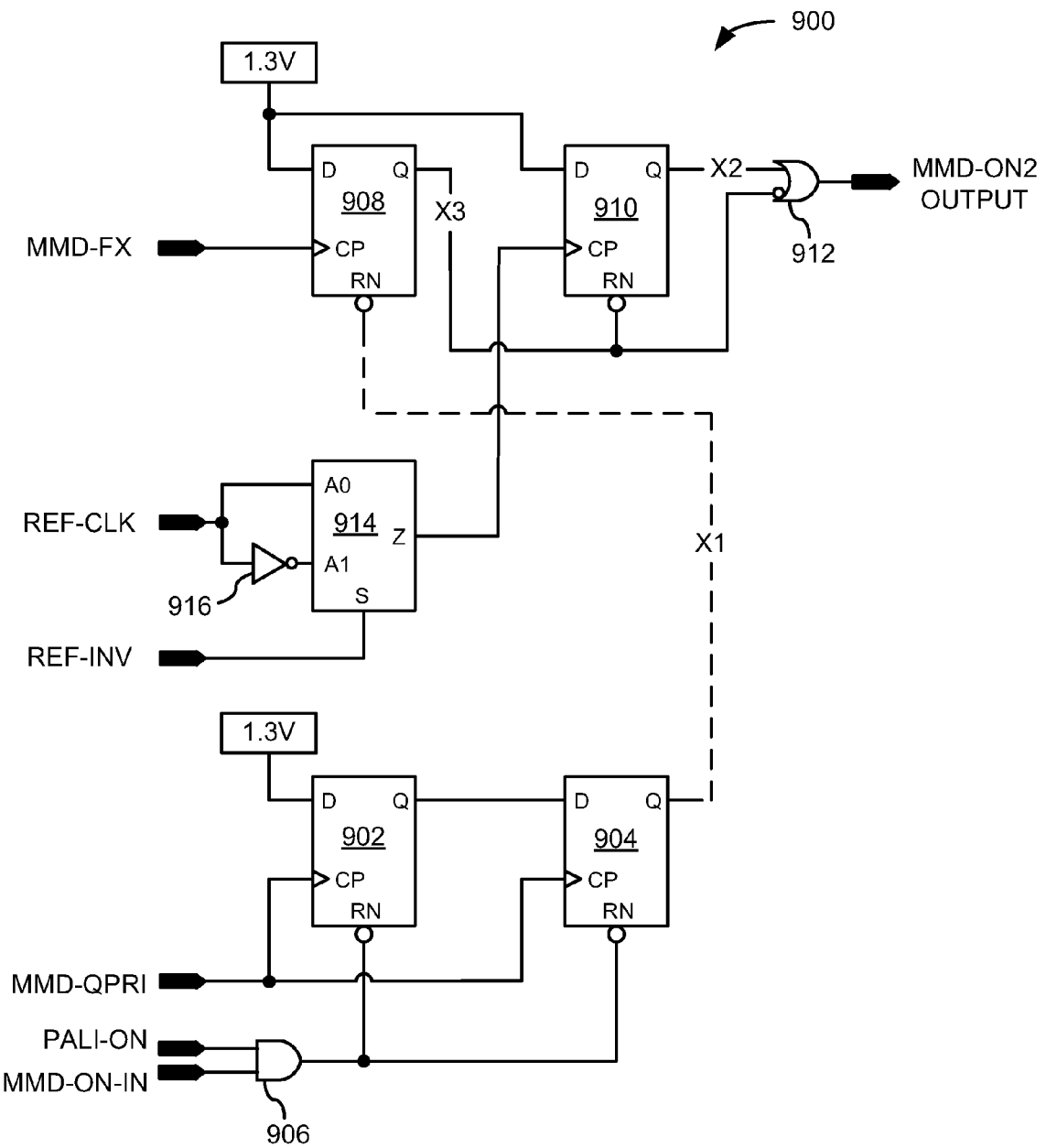
FIG. 9 is a schematic diagram depicting a digital circuit in accordance with the present teachings.

FIG. 9 shows a phase alignment circuit (hereinafter, circuit) 900 according to one implementation of the present teachings. The circuit 900 is illustrative and non-limiting in nature. Thus, other logic circuits configured to perform in accordance with the present teachings can also be used. The circuit 900 is illustrative of just one possible means for implementing functions of the PALI 610.

The circuit 900 includes a pair of D-type flip-flops 902 and 904, and an AND logic gate 906. Together, the components (or functional blocks) 902-906 cooperate to provide an internal enable/disable signal "X1" in response to input signals MMD-QPRI, PALI-ON and MMD-ON-IN signals. Both input signals PALI-ON and MMD-ON-IN must be asserted (i.e., "high") in order for the flip-flops 902-904 to cycle according to clock input signal MMD-QPRI. Otherwise, the X1 signal is de-asserted and remains "low", as do the "X2" and "X3" signals, and the MMD-ON2 signal stays "high", keeping the circuit 900 in an overall inactive state. Phase alignment is activated only when both signals PALI-ON and MMD-ON-IN are asserted. The flip-flops 902 and 904 serve to provide a brief propagation delay in generating the internal enable/disable signal X1. While two flip-flops 902-904 are shown, it is to be understood that one, two, three or more flip-flops can be used in order to establish the desired propagation delay in generating the enable/disable signal X1.

The circuit 900 also includes another pair of D-type flip-flops 908 and 910 and an OR logic gate 912. The components (i.e., functional blocks 908-912) cooperate to provide the MMD-ON2 signal as described above, in response to the MMD-FX signal as described above and the internal enable/disable signal X1. Furthermore, the flip-flop 910 is coupled to receive a clock input signal from a selector (i.e., multiplexer) 914. The selector 914 is coupled receive a reference clock signal REF-CLK by way of an inverter 916, and a inverted version of the reference frequency signal designated REF-INV. Other internal signals X2 and X3 are provided by the flip-flops 908 and 910, respectively.

The phase alignment process is triggered (initiated) by setting the MMD-ON2 signal to "low". After the phase alignment has been completed the DPLL locks, and the circuit 900 is in an inactive state. During the inactive state, the internal signals X2 and X3 both remain "high" and the MMD-ON2 signal remains "high" until the next lock-in procedure is initiated. It is noted that additional flip-flop stages (not shown) can be added (i.e., daisy chained) beyond flip-flop 910 so as to introduce additional signal propagation delay, if desired.

Illustrative Apparatus

Figure 10:
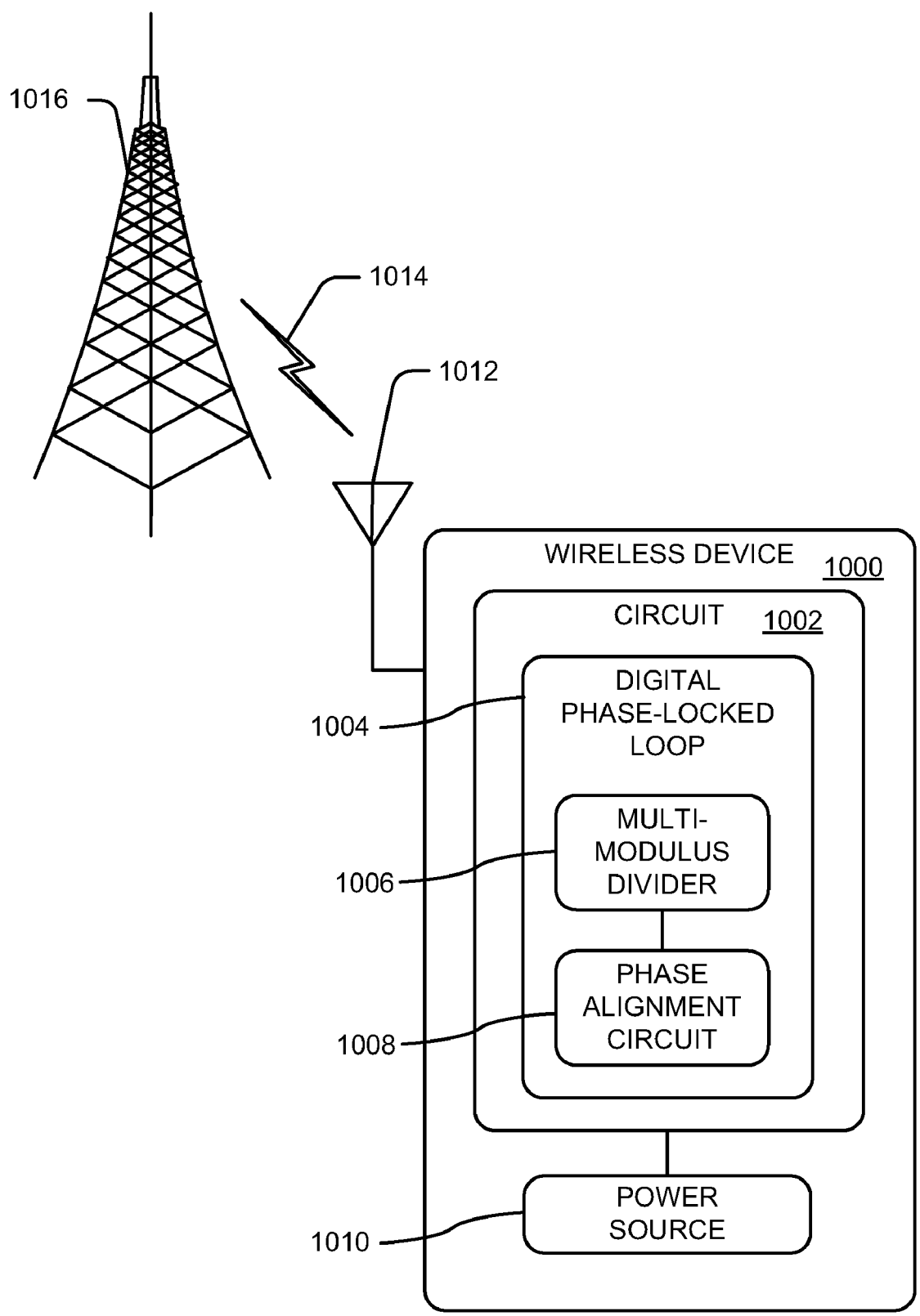
FIG. 10 is a block diagram depicting an apparatus in accordance with the present teachings.

FIG. 10 is a block diagrammatic view depicting a wireless device (i.e., apparatus) 1000 including aspects of the present teachings. For purposes of non-limiting example, the wireless device 1000 is presumed to include various resources that are not specifically depicted in the interest of clarity. The wireless device 1000 is further presumed to be configured to perform in one or more wireless operating modes (e.g., cellular communications, global positioning system (GPS) reception, etc.).

The wireless device 1000 includes a circuit 1002. The circuit 1002 includes, among other possible features, a digital phase-locked loop (DPLL) 1004. The DPLL 1004 includes a multi-modulus divider (MMD) 1006 and a phase alignment circuit (PALI) 1008 configured to perform in accordance with the present teachings. As such, the PALI 1008 is configured to controllably enable and disable the MMD 1006 during new frequency lock-in procedures of the DPLL 1004 in accordance with the present teachings.

The wireless device 1000 further includes a source of electrical energy or "power source" 1010. In one or more implementations, the power source 1010 is defined by one or more batteries. In other implementations, the power source 1010 may be defined by an inductively coupled power supply that is energized by an electromagnetic illumination field provided by some entity external to the wireless device 1000. Other types of power source 1010 may also be used. In any case, the power source 1010 is coupled so as to provide electrical energy to the circuit 1002. In this way, the wireless device 1000 is presumed to be operable in a portable manner.

The wireless device 1000 further includes an antenna 1012. The wireless device 1000 is presumed to operate by way of wireless signals 1014 between the antenna 1012 and a wireless network 1016. A single cellular tower 1016 is depicted in the interest of simplicity. However, it is to be understood that other resources (not shown) of a corresponding wireless network are also present and operative as needed so as to enable the wireless device 1000 to perform its various functions (cellular communications, Internet access, etc.). The wireless device 1000 is a general and non-limiting example of countless devices and systems that may be configured and operating in accordance with the means and techniques of the present teachings.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. Electronic circuitry comprising a phase alignment circuit and a digital controlled oscillator (DCO) and a frequency divider, the electronic circuitry configured to:
  use the phase alignment circuit to determine a phase relationship between a first signal and a second signal, the second signal derived by dividing an output signal provided by the DCO;
  use the phase alignment circuit to disable operation of the frequency divider in accordance with the determination, the state of the frequency divider being preserved during the disabling; and
  use the phase alignment circuit to enable operation of the frequency divider in response to a next rising edge of the first signal, the frequency divider counting toward a predetermined state, the frequency divider providing an output pulse whenever the frequency divider reaches the predetermined state,
  wherein the phase alignment circuit comprises:
  a first circuit portion including at least one flip-flop, the first circuit portion configured to provide an internal enable/disable signal responsive to a first enable signal and a second enable signal and a first clock signal, the first clock signal corresponding to a divided-by-N digital controlled oscillator output signal;
  a second circuit portion including a selector, the second circuit portion configured to provide a second clock signal responsive to a reference clock input signal and an inverted reference input signal; and
  a third circuit portion including at least two other flip-flops, the third circuit portion configured to provide a frequency divider enable/disable signal responsive to the internal enable/disable signal and the second clock signal and a third clock signal, the third clock signal corresponding to a phase relationship between the first signal and the second signal.

2. The electronic circuitry according to claim 1, wherein:
  the first signal is defined by a reference frequency signal; and
  the reference frequency signal is characterized by a frequency less than that of the output signal provided by the DCO.

3. The electronic circuitry according to claim 1, wherein the frequency divider is defined by a programmable divider.

4. The electronic circuitry according to claim 1, wherein the electronic circuitry includes a time-to-digital converter (TDC) configured to provide a time difference signal corresponding to a phase difference between the first signal and the output pulse.

5. The electronic circuitry according to claim 4, wherein the electronic circuitry includes a digital loop filter (DLF) configured to provide a frequency control word to the DCO in accordance with the time difference signal.

6. The electronic circuitry according to claim 5, wherein the TDC, the DLF, the DCO, and the frequency divider are respective portions of a feedback control loop.

7. The electronic circuitry according to claim 1, wherein the frequency divider receives the DCO output signal as a clock input signal.

8. The electronic circuitry according to claim 1, wherein at least a portion of the electronic circuitry is defined by an integrated circuit chip.

9. A phase alignment circuit configured to:
  receive a first signal corresponding to a phase relationship between a reference frequency signal and a divided-by-N digital controlled oscillator output signal;
  provide a first level output signal by a first circuit portion including at least one flip-flop, the first level output signal responsive to a predetermined state of the first signal, the first output signal further responsive to a first enable signal and a second enable signal and a first clock signal, the first clock signal corresponding to the divided-by-N digital controlled oscillator output signal, wherein the first level output signal is configured to disable operation of a frequency divider;
  provide a second clock signal by a second circuit portion including a selector, the second clock signal responsive to a reference clock input signal and an inverted reference input signal; and
  provide a second level output signal by a third circuit portion including at least two other flip-flops, the second level output signal responsive to a next rising edge of the reference frequency signal, the second level output signal further responsive to the first level output signal and the second clock signal and a third clock signal, the third clock signal corresponding to the phase relationship between the reference frequency signal and the divided-by-N digital controlled oscillator output signal, wherein the second level output signal is configured to enable operation of the frequency divider.

10. The phase alignment circuit according to claim 9, wherein the phase alignment circuit is further configured to assume an active or inactive state in accordance with at least one input signal.

11. The phase alignment circuit according to claim 9, wherein the phase alignment circuit is further configured to:
  remain in an inactive state unless a phase alignment procedure is triggered by one or more input signals; and
  provide a continuous second level output signal when in the inactive state.

12. A method performed at least in part by an electronic circuit, the method comprising:
   measuring a phase relationship between a reference frequency signal and a divided-by-N digital controlled oscillator output signal;
   disabling operation of a frequency divider in accordance with the measuring, the disabling based on an internal enable/disable signal provided by a first circuit portion including at least one flip-flop, wherein the present state of the frequency divider is preserved during the disabling, and wherein the internal enable/disable signal is responsive to a first enable signal and a second enable signal and a first clock signal, the first clock signal corresponding to the divided-by-N digital controlled oscillator output signal;
   providing a second clock signal by a second circuit portion including a selector, the second clock signal responsive to a reference clock input signal and an inverted reference input signal;
   enabling operation of the frequency divider in response to a next rising edge of the reference frequency signal, the enabling based on a frequency divider enable/disable signal provided by a third circuit portion including at least two other flip-flops, wherein the frequency divider is counting toward a predetermined state, and wherein the frequency divider enable/disable signal is responsive to the internal enable/disable signal and the second clock signal and a third clock signal, the third clock signal corresponding to a phase relationship between the reference frequency signal and the divided-by-N digital controlled oscillator output signal; and
   providing an output pulse in response to the frequency divider reaching the predetermined state.

13. The method according to claim 12, wherein the reference frequency signal is characterized by a frequency less than that of the digital controlled oscillator output signal.

14. The method according to claim 12, wherein the frequency divider is defined by a programmable divider.

15. The method according to claim 12, further comprising providing a time difference signal corresponding to a phase difference between the reference frequency signal and the output pulse.

16. The method according to claim 15, further comprising controlling the digital controlled oscillator output signal in accordance with the time difference signal.

17. An electronic circuit, comprising:
   a first circuit portion including at least one flip-flop, the first circuit portion configured to provide an internal enable/disable signal responsive to a first enable signal and a second enable signal and a first clock signal, the first clock signal corresponding to a divided-by-N digital controlled oscillator output signal;
   a second circuit portion including a selector, the second circuit portion configured to provide a second clock signal responsive to reference clock input signal and an inverted reference input signal; and
   a third circuit portion including at least two other flip-flops, the third circuit portion configured to provide a frequency divider enable/disable signal responsive to the internal enable/disable signal and the second clock signal and a third clock signal, the third clock signal corresponding to a phase relationship between a reference frequency signal and the divided-by-N digital controlled oscillator output signal.

18. The electronic circuit according to claim 17, wherein at least a portion of the electronic circuit is defined by an integrated circuit chip.

19. An apparatus, comprising:
   a source of electrical energy; and
   a circuit coupled to the source of electrical energy, the circuit including a digital phase-locked loop and a phase alignment circuit, the phase alignment circuit configured to controllably enable and disable a frequency divider of the digital phase-locked loop during a frequency lock-in procedure,
   wherein the phase alignment circuit comprises:
   a first circuit portion including at least one flip-flop, the first circuit portion configured to provide an internal enable/disable signal responsive to a first enable signal and a second enable signal and a first clock signal, the first clock signal corresponding to a divided-by-N digital controlled oscillator output signal;
   a second circuit portion including a selector, the second circuit portion configured to provide a second clock signal responsive to a reference clock input signal and an inverted reference input signal; and
   a third circuit portion including at least two other flip-flops, the third circuit portion configured to provide a frequency divider enable/disable signal responsive to the internal enable/disable signal and the second clock signal and a third clock signal, the third clock signal corresponding to a phase relationship between a reference frequency signal and the divided-by-N digital controlled oscillator output signal.

20. The apparatus according to claim 19, wherein the frequency divider of the digital phase-locked loop is defined by a programmable divider.

* * * * *